(12) United States Patent
Altice, Jr. et al.

(10) Patent No.: US 7,485,836 B2
(45) Date of Patent: Feb. 3, 2009

(54) ROW DRIVER FOR SELECTIVELY SUPPLYING OPERATING POWER TO IMAGER PIXEL

(75) Inventors: Peter P. Altice, Jr., Lake Oswego, OR (US); Jeffrey Bruce, Meridian, ID (US); Jeffrey A. McKee, Meridian, ID (US); Joey Shah, Thousand Oaks, CA (US); Richard A. Mauritzson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/643,681

(22) Filed: Dec. 22, 2006

(65) Prior Publication Data

US 2007/0102624 A1    May 10, 2007

Related U.S. Application Data

(62) Division of application No. 11/265,154, filed on Nov. 3, 2005, now Pat. No. 7,176,434, which is a division of application No. 10/766,012, filed on Jan. 29, 2004, now Pat. No. 7,196,304.

(51) Int. Cl.
*H01L 27/00* (2006.01)
(52) U.S. Cl. ............... 250/208.1; 348/308; 250/214.1
(58) Field of Classification Search ........... 250/208.1, 250/214 R, 214.1; 348/308, 313; 257/291, 257/292; 358/313
See application file for complete search history.

(56) References Cited

U.S. PATENT DOCUMENTS

| | | | |
|---|---|---|---|
| 4,744,057 A | 5/1988 | Descure et al. | |
| 5,041,890 A | 8/1991 | Pruvot | |
| 5,877,715 A | 3/1999 | Gowda et al. | |
| 5,898,168 A | 4/1999 | Gowda et al. | |
| 5,920,274 A | 7/1999 | Gowda et al. | |
| 6,115,066 A | 9/2000 | Gowda et al. | |
| 6,184,055 B1 | 2/2001 | Yang et al. | |
| 6,344,877 B1 | 2/2002 | Gowda et al. | |
| 6,888,573 B2 | 5/2005 | Herold | |
| 6,911,640 B1 * | 6/2005 | Bencuya et al. | 250/208.1 |
| 7,002,231 B2 | 2/2006 | Rhodes et al. | |
| 2002/0018133 A1 * | 2/2002 | Mendis et al. | 348/308 |

(Continued)

FOREIGN PATENT DOCUMENTS

WO    WO 03/054922    *    7/2003

*Primary Examiner*—Georgia Y Epps
*Assistant Examiner*—Tony Ko
(74) *Attorney, Agent, or Firm*—Dickstein Shapiro LLP

(57) ABSTRACT

An imaging system includes a pixel that does not require a row select transistor. Instead, an operating voltage is selectively provided to the pixel's readout circuitry, and the readout circuitry provides output signals based on charge or voltage of a storage node. The operating voltage can be selectively provided to each row of a pixel array by a row driver. Each pixel includes a source follower transistor that provides an output signal on a column output line for readout. An anti-blooming transistor may be linked to each pixel's photosensor to provide an overflow path for electrons during charge integration, prior to transfer of charge to the pixel's storage node by a transfer transistor. Electrons not produced by an image are introduced to the photosensor prior to image acquisition, filling traps in the photosensor to reduce image degradation.

11 Claims, 9 Drawing Sheets

U.S. PATENT DOCUMENTS

2004/0036784 A1* 2/2004 Bock .......................... 348/308
2004/0174450 A1* 9/2004 Lee et al. .................... 348/308
2005/0083421 A1 4/2005 Berezin et al.
2005/0083422 A1* 4/2005 Lee et al. .................... 348/308

* cited by examiner

ROW DRIVER FOR SELECTIVELY SUPPLYING OPERATING POWER TO IMAGER PIXEL

This application is a divisional of U.S. patent application Ser. No. 11/265,154, filed on Nov. 3, 2005 now U.S. Pat No. 7,176,434, which is a divisional of U.S. patent application Ser. No. 10/766,012 filed on Jan. 29, 2004 now U.S. Pat No. 7,196,304, both of which are incorporated herein, by entirety.

FIELD OF THE INVENTION

The invention relates generally to improving the control and operation of an imager pixel.

BACKGROUND OF THE INVENTION

An imager, for example, a CMOS imager includes a focal plane array of pixel cells; each cell includes a photosensor, for example, a photogate, photoconductor or a photodiode overlying a substrate for producing a photo-generated charge in a doped region of the substrate. A readout circuit is provided for each pixel cell and typically includes at least a source follower transistor and a row select transistor for coupling the source follower transistor to a column output line. The pixel cell also typically has a charge storage node, for example, a floating diffusion node which is, in turn, connected to the gate of the source follower transistor. Charge generated by the photosensor is stored at the storage node. In some arrangements, the imager may also include a transistor for transferring charge from the photosensor to the storage node. The imager also typically includes a transistor to reset the storage node before it receives photo-generated charges.

In a CMOS imager pixel cell, for example, a four transistor (4T) pixel cell 100 as depicted in FIG. 1, the active elements of a pixel cell perform the functions of (1) photon to charge conversion by photodiode 102; (2) transfer of charge to the floating diffusion node 108 by the transfer transistor 104; (3) resetting the floating diffusion node to a known state before the transfer of charge to it by reset transistor 106; (4) selection of a pixel cell for readout by row select transistor 112; and (5) output and amplification of a signal representing a reset voltage and a pixel signal voltage based on the photo converted charges by source follower transistor 110, which has its gate connected to the floating diffusion node 108. The pixel of FIG. 1 is formed on a semiconductor substrate as part of an imager device pixel array.

FIG. 2 illustrates a block diagram of a CMOS imager device 908 having a pixel array 200 with each pixel cell being constructed as described above, or as other known pixel cell circuits. Pixel array 200 comprises a plurality of pixels arranged in a predetermined number of columns and rows (not shown). The pixels of each row in array 200 are all turned on at the same time by a row selected line, and the pixels of each column are selectively output by respective column select lines. A plurality of rows and column lines are provided for the entire array 200. The row lines are selectively activated in sequence by the row driver 210 in response to row address decoder 220 and the column select lines are selectively activated in sequence for each row activation by the column driver 260 in response to column address decoder 270. Thus, a row and column address is provided for each pixel.

The CMOS imager is operated by control circuit 250, which controls address decoders 220, 270 for selecting the appropriate row and column lines for pixel readout, and row and column driver circuitry 210, 260 which apply driving voltage to the drive transistors of the selected row and column lines. The pixel output signals typically include a pixel reset signal $V_{rst}$ taken off of the floating diffusion node 108 when it is reset by reset transistor 106 and a pixel image signal $V_{sig}$, which is taken off the floating diffusion node 108 after photo-generated charges generated by an image are transferred to it. The $V_{rst}$ and $V_{sig}$ signals are read by a sample and hold circuit 265 and are subtracted by a differential amplifier 267, which produces a signal $V_{rst}$-$V_{sig}$ for each pixel, which represents the amount of light impinging on the pixels. This difference signal is digitized by an analog to digital converter 275. The digitized pixel signals are then fed to an image processor 280 to form a digital image. The digitizing and image processing can be located on or off the imager chip. In some arrangements the differential signal $V_{rst}$-$V_{sig}$ can be amplified as a differential signal and directly digitized by a differential analog to digital converter.

As shown in FIG. 1, the conventional four transistor (4T) pixel requires an operating voltage Vcc, as well as transfer TG, row select ROW and reset RST control signals for operation.

BRIEF SUMMARY OF THE INVENTION

Method and apparatus embodiments of the present invention provide a new pixel design for an imager in which the pixel is operated with a row driver signal which supplies operating power and selects the pixel for operation and readout, and a reset and transfer control signal.

In one exemplary embodiment, the pixel cell includes a photosensor, a transfer transistor operated by a transfer control signal, a storage node for receiving transferred charges from the photosensor, reset transistor for the resetting of the storage node operated by a reset control signal and output transistor having a gate coupled to the storage node and receiving operating power and providing a selective readout in response to the row driver signal.

In another aspect of the exemplary embodiment, the pixel cell having the foregoing construction can be operated to precharge the photosensor with electrons to mitigate against loss of photo-generated image charges during charge transfer to the storage node.

In another exemplary embodiment, the pixel cell includes an anti-blooming transistor coupled to the row driver signal and photosensor which provides an overflow path for electrons to reduce over saturation of the photosensor.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

Figure 1:
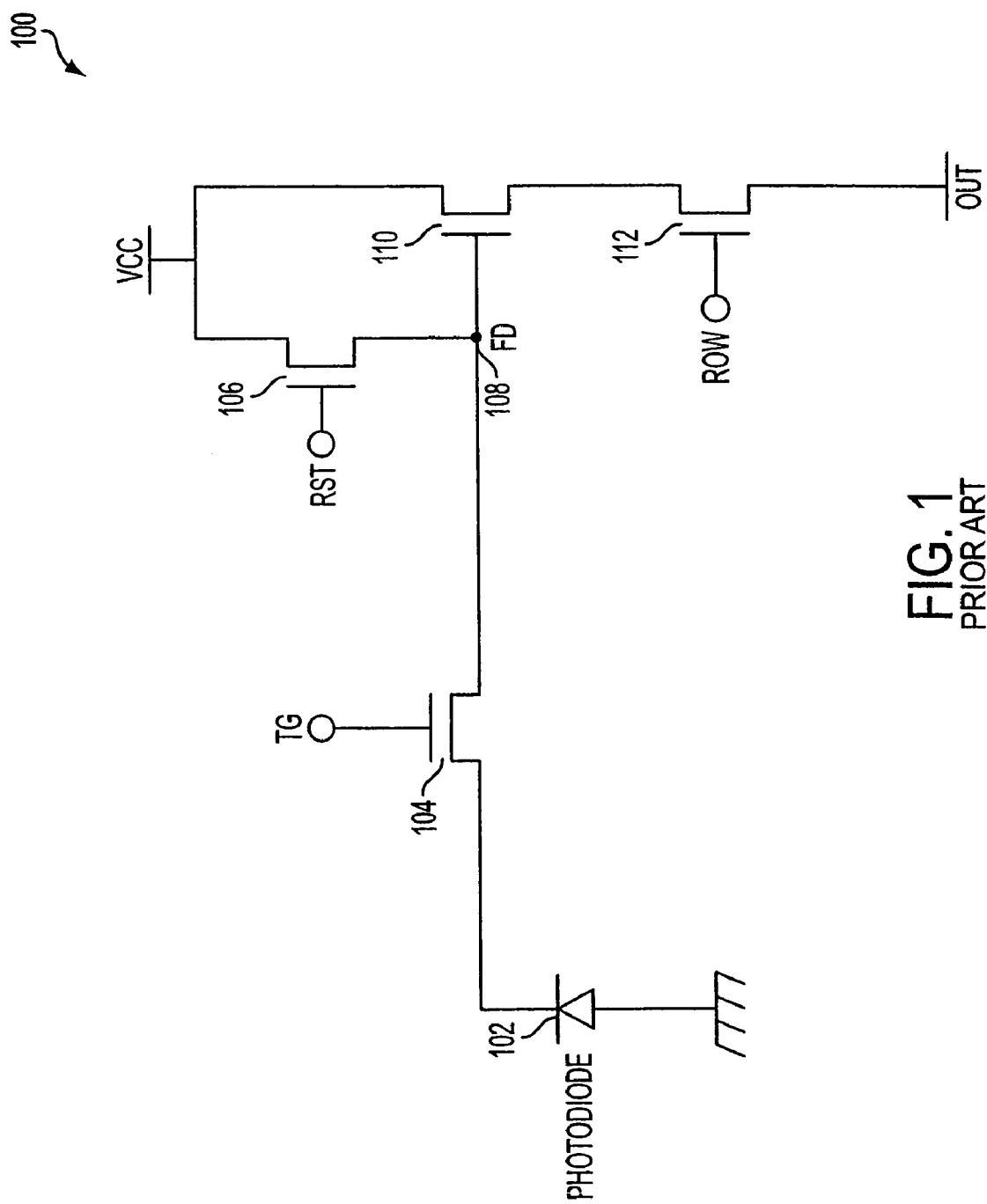
FIG. 1 is a schematic diagram of a conventional four transistor pixel.
Figure 2:
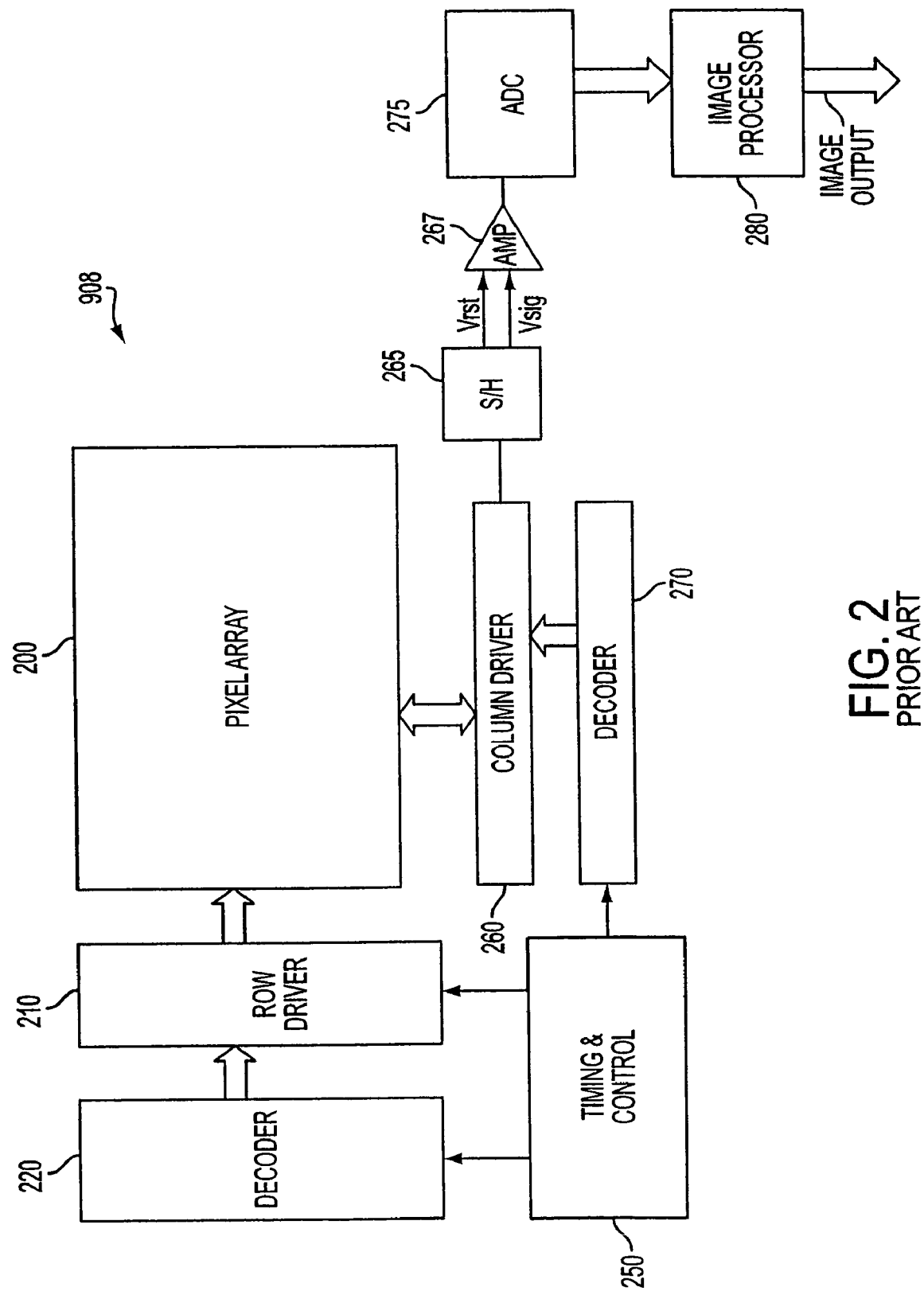
FIG. 2 is a block diagram of a conventional imager device.

The term "pixel" refers to a photo-element unit cell containing a photoconversion device or photosensor and transistors for processing an electrical signal from electromagnetic radiation sensed by the photoconversion device such as imager 908 (FIG. 2). The embodiments of pixels discussed herein are illustrated and described as employing three transistor (3T) or four transistor (4T) pixel circuits for the sake of example only. It should be understood that the invention may be used with other pixel arrangements having more than three transistors.

Although the invention is described herein with reference to the architecture and fabrication of one pixel cell, it should be understood that this is representative of a plurality of pixels in an array of an imager device such as imager 908 (FIG. 2). In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 3:
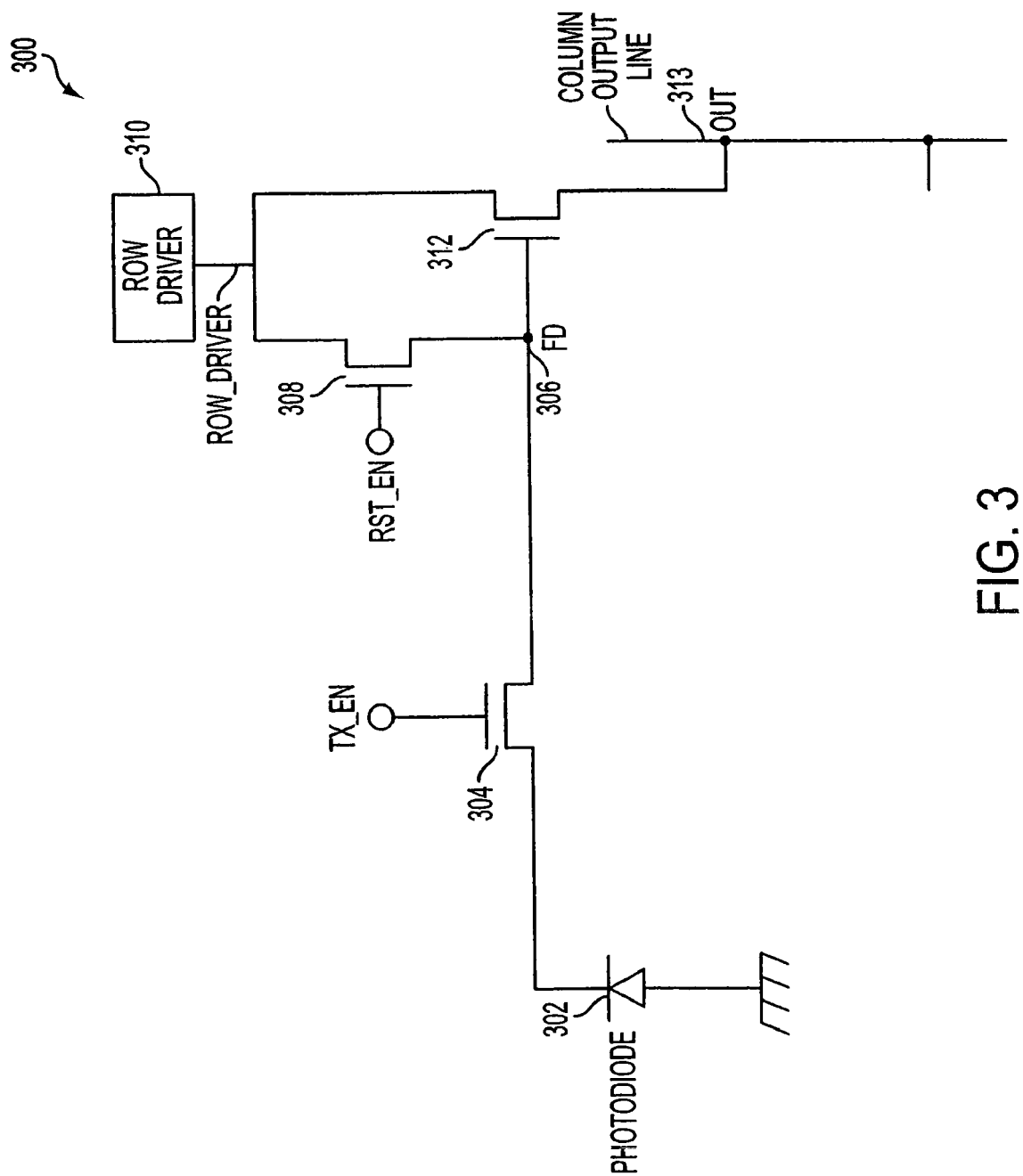
FIG. 3 is a schematic circuit diagram according to a first embodiment of the invention.

FIG. 3 illustrates an exemplary circuit 300 for a pixel of a CMOS imager according to a first exemplary embodiment of the invention. The pixel includes a photosensor, e.g. a photodiode 302, transfer transistor 304, a floating diffusion node 306, and a reset and readout circuit including reset transistor 308, source follower transistor 312 and row driver circuit 310. Row driver circuit 310 supplies operating power and reset voltage levels to the pixel 300 in the form of a row driver signal ROW_DRIVER, which can be provided in the same manner as row driver 210 (FIG. 2). It should be understood, that when the pixel 300 is employed in a pixel array, a plurality of like pixels are arranged in rows and columns and all pixels in a row receive ROW_DRIVER from a common row driver circuit 310 while all pixels in a column are coupled to provide output signals on a common column line 313.

The illustrated pixel 300 is formed on a semiconductor substrate. The photodiode 302 generates and accumulates signal charge in response to incident light during a charge integration period. After the integration period, the charge is transferred via the transfer transistor 304 to the floating diffusion node 306. Shutter timing signals are used to initiate a charge integration operation of the pixel 300.

Figure 4:
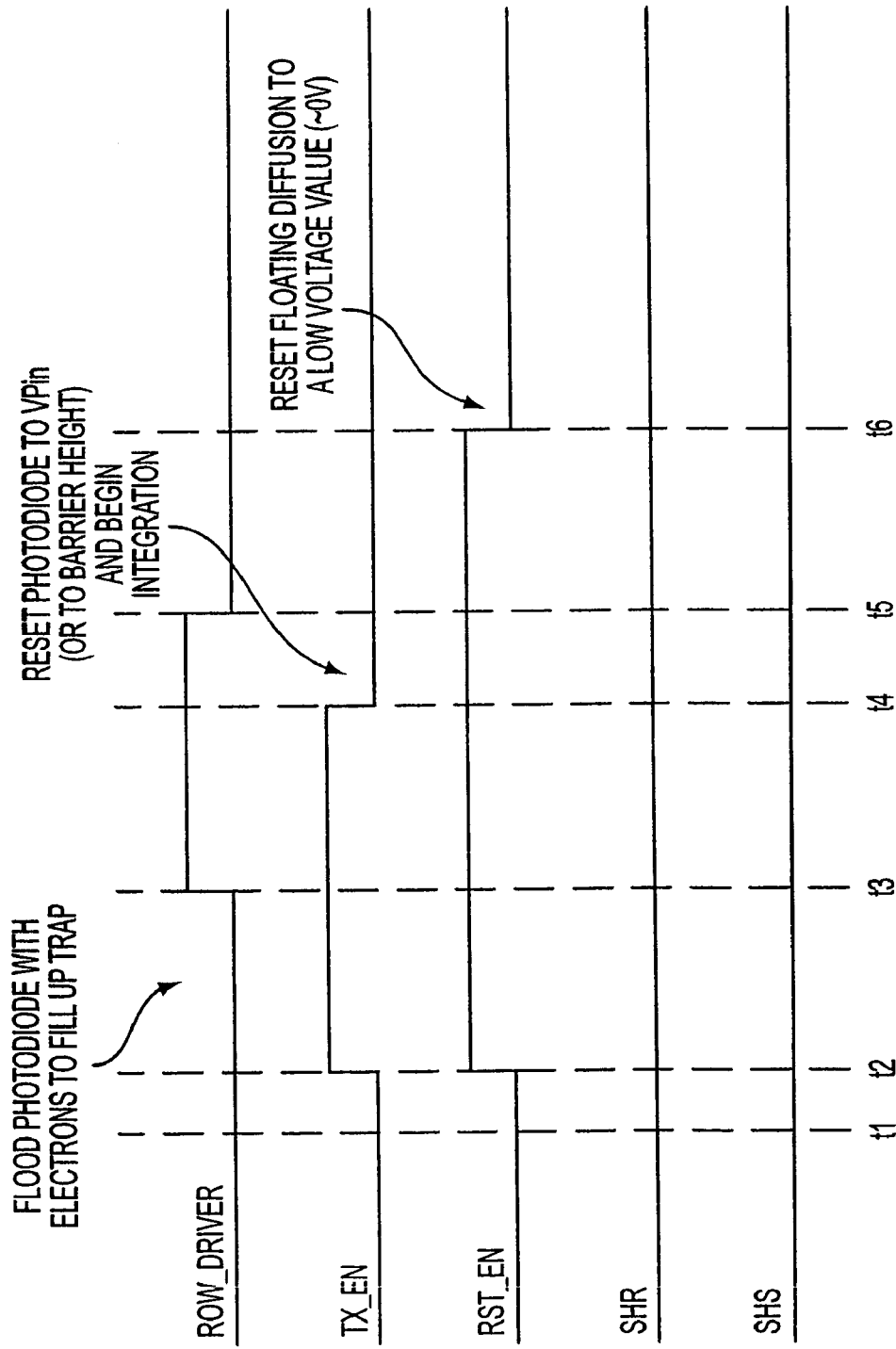
FIG. 4 is a timing diagram for shutter operation of the FIG. 3 embodiment.

FIG. 4 illustrates the shutter timing signals for operating the FIG. 3 pixel. Referring now to FIGS. 3 and 4, initially, at time t1, the signal ROW_DRIVER is set low and thereafter the gate control signals for transfer transistor 304 (TX_EN) and reset transistor 308 (RST_EN) are set high at time t2 causing electrons to fill photodiode 302 and floating diffusion node 306. ROW_DRIVER is provided to a channel terminal of reset transistor 308, illustratively the source terminal. The electrons are drawn to the photodiode 302 and floating diffusion node 306 because both photodiode 302 and floating diffusion node 306 are initially at a higher potential Vpin, for example, 2.3 volts. When ROW_DRIVER is set low the actual voltage of ROW_DRIVER still remains above ground (for example, 0.1 volts) to prevent an injection of electrons into the substrate. With row driver 310 set low and an influx of electrons flowing into photodiode 302 and floating diffusion node 306, the potential of photodiode 302 and floating diffusion node 306 is subsequently reduced to, for example, 0.1 volts.

Next, while the gate control signals for transfer transistor 304 and reset transistor 308 remain high, the ROW_DRIVER signal is set high at time t3. This drains the electrons from photodiode 302 and floating diffusion node 306, thereby resetting photodiode 302 to Vpin. In addition, any electron traps within photodiode 302 caused by an inherent barrier voltage Vbarrier (FIG. 5 discussed below) are filled with electrons previously introduced to photodiode 302 when ROW_DRIVER was set low. The timing illustrated at t2 and t3 is for precharging the photosensor with electrons to mitigate against the loss of photo-generated image charges during charge transfer to the storage node, this precharging is an optional operation.

Next, while RST_EN and ROW_DRIVER remain high, TX_EN is set low at time t4. This turns off transfer transistor 304 and photodiode 302 is now isolated from the floating diffusion node 306. With photodiode 302 reset to Vpin and isolated from floating diffusion node 306, charge integration for photodiode 302 now begins.

Next, while RST_EN is high and TX_EN is low, ROW_DRIVER is set low at time t5. Setting ROW_DRIVER low forces the floating diffusion node 306 to a potential of approximately 0.1 volts, which turns off source follower transistor 312 to isolate the output bus shared by pixels in each column.

Next, while TX_EN and ROW_DRIVER are low, RST_EN is set also low at time t6. This turns off reset transistor 308 low and floating diffusion node 306 is isolated from the ROW_DRIVER signal. Since the floating diffusion node 306 is also now set low there is no output from the source follower transistor 312.

The shutter timing signals in FIG. 4 can be applied concurrently to all pixels in an imager array 200 (FIG. 2). As a result, all photodiodes 302 in the array begin integration concurrently and all source follower transistors 312 are turned off concurrently by setting all floating diffusion nodes 306 to a turn off voltage, for example 0.1 volts.

Figure 5:
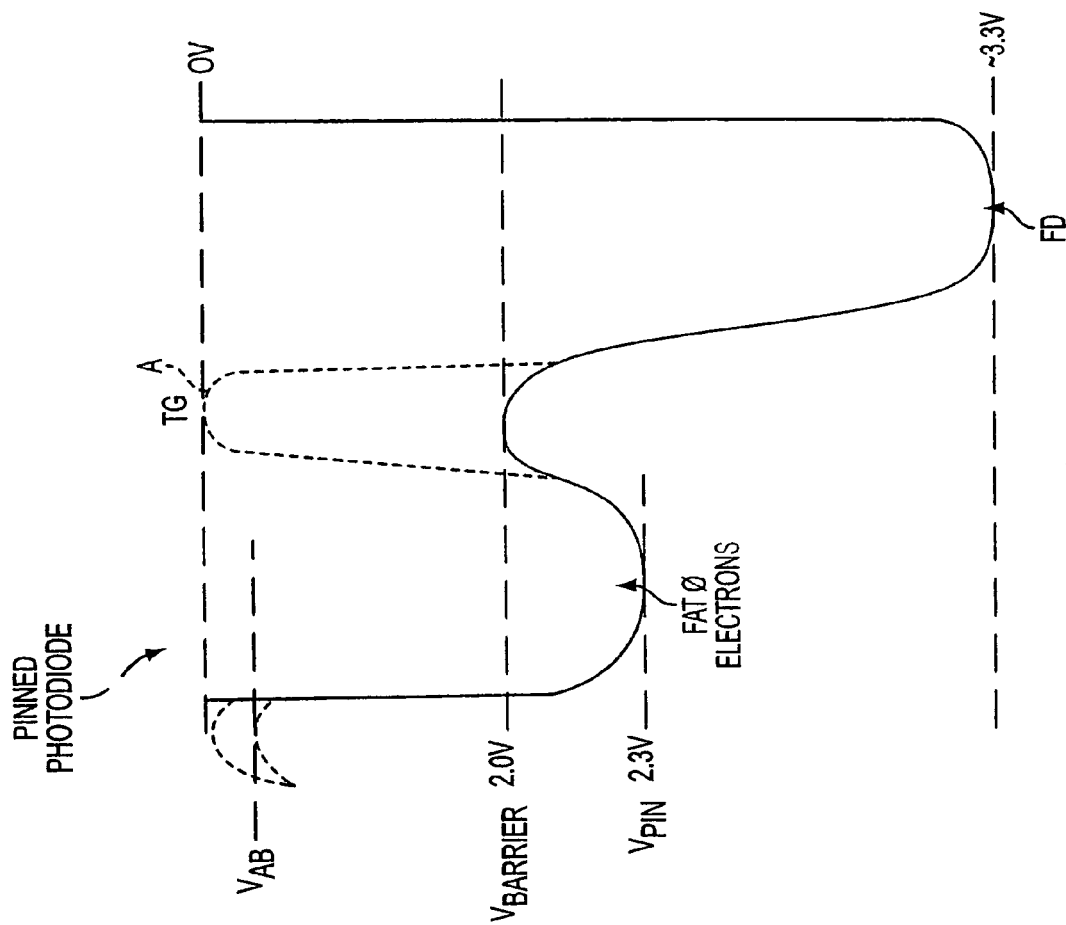
FIG. 5 is a voltage threshold diagram for a pinned photodiode used in the FIG. 3 embodiment.

FIG. 5 illustrates the potential diagram of the photodiode 302, transfer gate TG and floating diffusion node FD. When the transfer transistor 304 is turned off by TX_EN going low at time t4, a barrier exists impeding charge transfer between photodiode 302 and floating diffusion node 306 which is shown by A. While the barrier A exists between the photodiode 302 and floating diffusion node 306, charge integration from a signal produced by light incident on the photodiode 302 occurs. Subsequently, as described below, when TX_EN goes high again, the barrier A falls to the level of Vbarrier allowing electrons to transfer from the photodiode 302 to the floating diffusion node 306. However, even when the transfer gate 304 is on, a small barrier may still remain so that not all electrons in the photodiode 302 are transferred to the floating diffusion node 306. Some electrons remain trapped at photodiode 302. However, because the photodiode 302 was initially coupled to the ROW_DRIVER signal, the trap was filled, i.e., precharged, with non-image electrons, so image electrons acquired in photodiode 302 during integration are not lost during the charge transfer to floating diffusion node 306 due to the small remaining barrier between the photodiode 302 and floating diffusion node 306 when the transfer transistor 304 is on.

Figure 6:
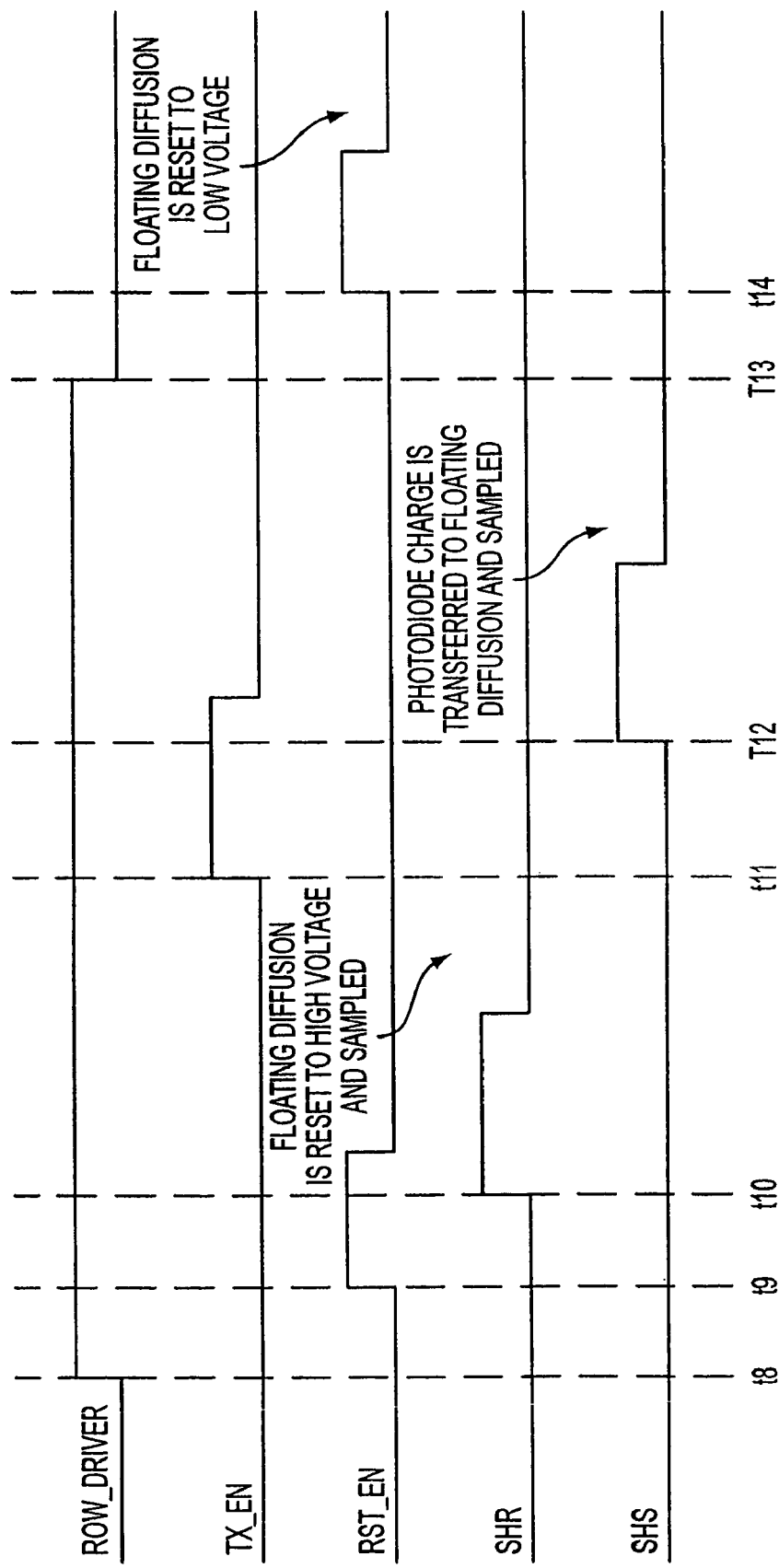
FIG. 6 is a timing diagram for charge readout of the FIG. 3 embodiment.

FIG. 6 illustrates a timing diagram for the FIG. 3 circuit 300 during pixel readout, which occurs after the shutter timing depicted in FIG. 4 and the charge integration at photodiode 302 is completed. Initially, the floating diffusion nodes 306 of all pixels in an imager array 200 (FIG. 2) are set to a predetermined voltage, for example 0.1 volts to ensure that all source follower transistors 312 are turned off as described above when ROW_DRIVER is low, TX_EN is low and RST_EN is high at time t5 (FIG. 4). The ROW_DRIVER signal of the pixel intended to be read is pulsed high at time t8 (FIG. 6) providing an operating voltage across source follower transistor 312. The floating diffusion node 306 of the pixel intended to be sampled is then reset at time t9 by briefly turning on reset transistor 314 supplied with operating voltage by ROW_DRIVER and signal RST_EN going high, thereby resetting floating diffusion node 306 to a predetermined ROW_DRIVER voltage (for example, 3.3 volts). The reset voltage level on the floating diffusion node 306 is then applied to the gate of source follower transistor 312, which converts it to a reset output voltage $V_{rst}$ on a column output line 313 (FIG. 3). The output signal is subsequently sampled at time t10, for example by a sample and hold circuit 265 (FIG. 2), where a high pulse SHR is used to sample and hold the reset output voltage $V_{rst}$ onto a first sample and hold capacitor.

Charge stored in photodiode 302 from a previous integration period is then transferred to floating diffusion node 306 by signal TX_EN going high at time t11 thereby, turning on transfer transistor 304 and lowering the potential barrier in FIG. 5 to Vbarrier. The transferred charge lowers the voltage on the floating diffusion node 306 to a pixel output signal level, which is applied to the gate of source follower transistor 312. Source follower transistor 312, which is still supplied with operating voltage by ROW_DRIVER being high, converts the signal voltage level to a signal output voltage $V_{sig}$ on the column output line. Sample and hold circuit 265 (FIG. 2) in response to a sample/hold pulse SHS at time t12 causes the pixel's signal output voltage $V_{sig}$ on the column line to be stored in a second sample and hold capacitor.

After $V_{sig}$ is sampled, the ROW_DRIVER signal is set to a low voltage above ground, for example 0.1 volts at time t13. Reset transistor 314 is briefly turned on again at time t14, setting floating diffusion node 306 to a low voltage, for example 0.1 volts and the pixel circuit is ready for a next image capture frame.

Since transfer transistor 304 is positioned between photodiode 302 and floating diffusion node 306, the floating diffusion node 306 can be reset prior to transferring electrons. This permits a correlated double sampling operation resulting in reduced kTC noise and image noise. A global array signal may be implemented to control multiple row drivers 310 and the reset transistors 308 in an imager array; however, the transfer transistor 304 and the reset transistor 308 are controlled individually for each pixel.

As noted above with respect to the FIG. 5 potential diagram, when the transfer transistor 304 is on at time t11, all of the charge stored in the photodiode 302 may not be transferred to the floating diffusion node 306 because the pinning potential Vpin of the photodiode 302 is higher than the barrier voltage Vbarrier. As a result, some of the electrons generated during the integration period are trapped at the photodiode 302. However because the trap sites were initially filled at time t2 with non-image electrons, no image charges are lost.

Figure 7:
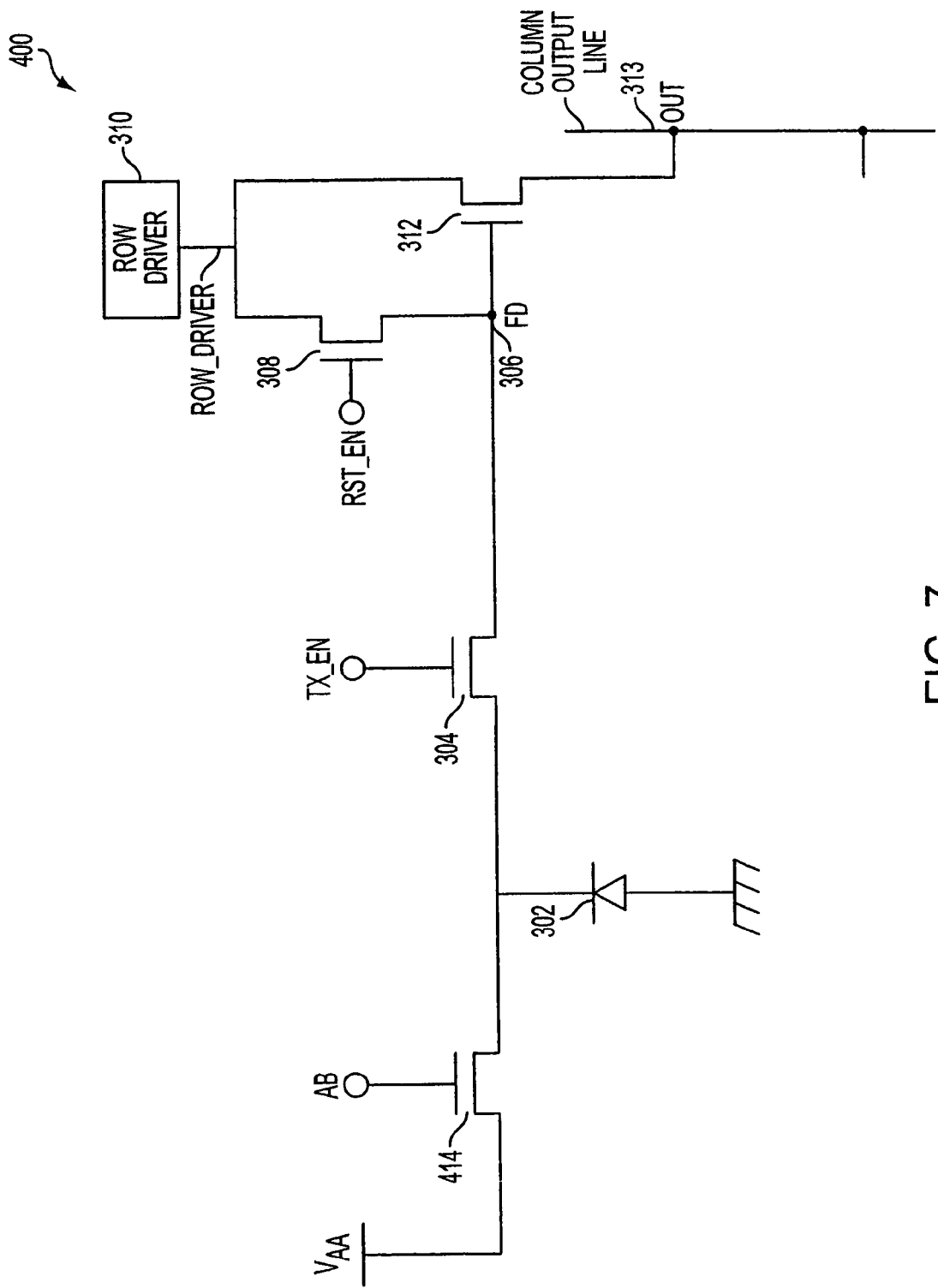
FIG. 7 is a schematic circuit diagram of a pixel according to a second embodiment of the invention.

FIG. 7 illustrates a modified pixel circuit 400 according to a second exemplary embodiment of the invention. This modified embodiment adds to the FIG. 3 pixel 300 an anti-blooming transistor 414 coupled to voltage source VAA, which is a high voltage, for example 3.3 volts. The anti-blooming transistor 414 is controlled by gate signal AB.

Pixel circuit 400 operates like pixel circuit 300; however, pixel circuit 400 includes an anti-blooming transistor 414 to provide an overflow path when photodiode 302 is approaching saturation, to drain excess charge from photodiode 302 when it is overexposed during charge integration. It should be noted that even when transistor 414 is turned on by control signal AB, a high charge barrier VAB (FIG. 5) is present between the photodiode 302 and anti-blooming transistor 414 that must be overcome, i.e. when photodiode 302 approaches saturation, before overflow charges are drained and flow through transistor 414.

Figure 8:
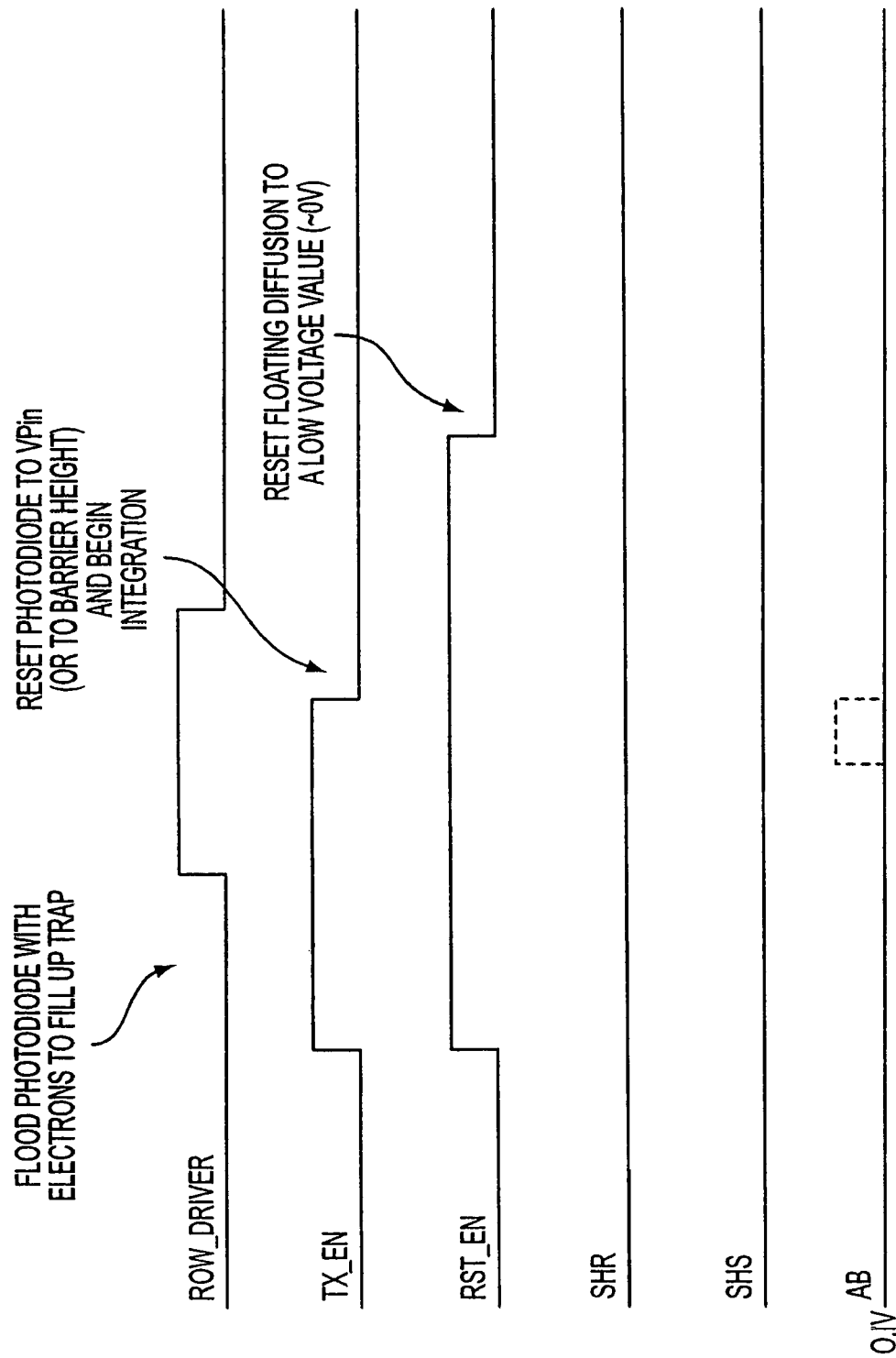
FIG. 8 is a timing diagram for shutter operation of the FIG. 7 embodiment.

FIG. 8 illustrates the shutter timing diagram for the FIG. 7 circuit. The control signals ROW_DRIVER, TX_EN and RST_EN operate according to that of pixel circuit 300 (FIG. 4). In addition, control signal AB controls the operation of anti-blooming transistor 414. When ROW-DRIVER and RST_EN are set high and TX_EN transitions from high to low, beginning charge integration in photodiode 302, signal AB is set to a constant voltage, for example 0.1 volts. This allows anti-blooming transistor 414 to provide a blooming path out of pixel circuit 400. With anti-blooming transistor 414 on during charge integration, the overflow path is created from the photodiode 302 to reduce over saturation by photodiode 302 during image acquisition, i.e., charge integration. Charge readout occurs using the same signal timing as that of the FIG. 3 circuit.

In a variation to the shutter timing for the FIG. 7 circuit, the AB signal could be pulsed high then held at a constant voltage, for example 0.1 volts, prior to charge integration. The pulsing of signal AB results in resetting pixel circuit 400. When signal AB is held at a constant voltage, an anti-blooming path is provided out of pixel circuit 400. In this instant, signal AB is pulsed and held for the rows that will be used to acquire an image, i.e., rows performing charge integration.

If the floating diffusion node 406 becomes saturated during charge transfer from photodiode 402 and electrons begin to overflow, these electrons will overflow into row driver 410 thereby providing an anti-blooming path for floating diffusion node 406.

Figure 9:
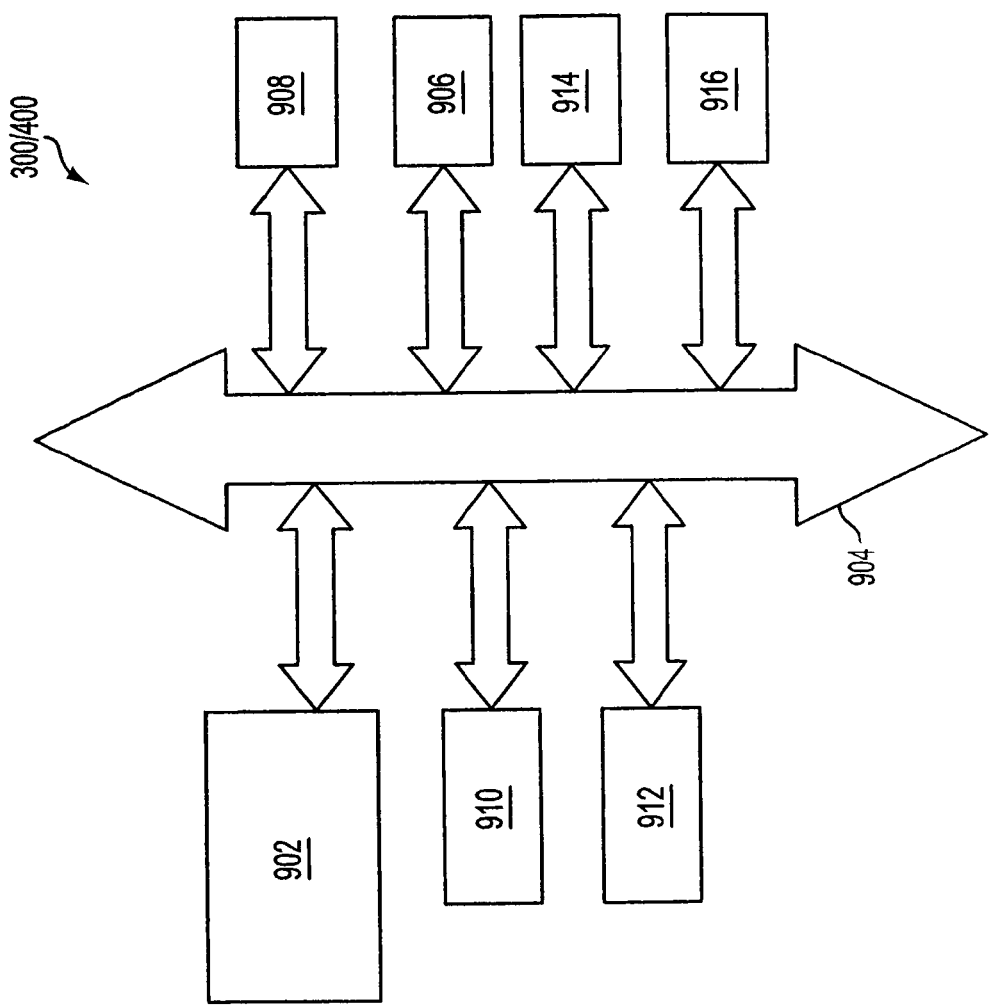
FIG. 9 is a diagram of a processing system which employs an imager employing an array of pixels constructed in accordance with the various embodiments of the invention.

FIG. 9 shows a processor system 900, which includes an imaging device 908 which is the same as FIG. 2, but as modified to use the pixels described herein. The imager device 908 may receive control or other data from system 900. System 900 includes a processor 902 having a central processing unit (CPU) that communicates with various devices over a bus 904. Some of the devices connected to the bus 904 provide communication into and out of the system 900; an input/output (I/O) device 906 and imager device 908 are such communication devices. Other devices which may be connected to the bus 904 provide memory, illustratively including a random access memory (RAM) 910, hard drive 912, and one or more peripheral memory devices such as a floppy disk or other memory drive 914 and compact disk (CD) drive 916. The imager device 908 may, in turn, be coupled to processor 902 for image processing, or other image handling operations. Examples of processor systems, which may employ the imager device 908, include, without limitation, computer systems, camera systems, scanners, machine vision systems, vehicle navigation systems, video telephones, surveillance systems, auto focus systems, image stabilization systems, and others.

The devices described above illustrate typical devices of many that could be used. The above description and drawings illustrate an embodiment, which achieves the features and advantages of the present invention. However, it is not intended that the present invention be strictly limited to the above-described and illustrated embodiment. Any modifications, though presently unforeseeable, of the present invention that come within the spirit and scope of the following claims should be considered part of the present invention.

What is claimed as new and desired to be protected by Letters Patent of the United States is:

1. A method of operating pixels of an image sensor comprising:
   applying a first voltage to a photosensor to flood the photosensor with pre-charge electrons;
   applying a second voltage to the photosensor to drain a portion of the pre-charge electrons off the photosensor, where the second voltage is higher than the first voltage;
   accumulating photo-generated charge in the photosensor from an image to be captured by the image sensor;
   providing an operating voltage across a source follower transistor;
   setting a floating diffusion node, which is coupled to a gate of the source follower transistor, to a high reset voltage that exceeds a threshold turn-on voltage of the source follower transistor;
   turning on a transfer transistor to transfer a charge from the photosensor to the floating diffusion node, changing the charge at the floating diffusion node to a signal voltage; and
   reading a signal provided by the source follower transistor in response to the signal voltage.

2. The method of claim 1, further comprising setting the floating diffusion node to a reset voltage lower than the threshold turn-on voltage of the source follower transistor to turn off the source follower transistor.

3. The method of claim 1 further comprising turning on an anti-blooming transistor to transfer overflow charge from a photosensor.

4. A method of operating a pixel, the method comprising:
   applying a first operating voltage to a photosensor in the pixel to store non-image electrons in the photosensor prior to accumulating photo-generated charge from an image to be captured by the pixel;
   applying a second operating voltage to the photosensor to drain at least some of the non-image electrons from the photosensor;
   initiating an integration period of accumulating photo-generated charge in the photosensor from light from the image; and
   providing the first and second operating voltages by a row driver;
   wherein the first operating voltage is applied to the photosensor through the following steps:
      lowering the row driver voltage to the first voltage, where the first voltage is lower than the second voltage;
      turning on a reset transistor to connect the row driver voltage to a floating diffusion node in the pixel; and
      turning on a transfer transistor to connect the floating diffusion node to the photosensor.

5. The method of claim 4, wherein the first operating voltage is lower than the second operating voltage.

6. The method of claim 4, wherein the step of applying the second voltage to drain non-image electrons comprises the following steps:
   maintaining a signal to the reset transistor sufficient to keep the reset transistor on;
   maintaining a signal to the transfer transistor sufficient to keep the transfer transistor on; and
   raising the row driver voltage to the second voltage.

7. The method of claim 6, wherein the first and second voltages are applied globally to the pixel array.

8. The method of claim 4, further comprising deselecting a pixel for readout through the following steps:
   lowering the row driver voltage to the first voltage, where the first voltage is lower than the second voltage; and
   turning on the reset transistor to connect the row driver voltage to the floating diffusion node, thereby turning off a source follower transistor in the pixel.

9. The method of claim 4, further comprising selecting a pixel for readout through the following steps:
   raising the row driver voltage to the second voltage, where the second voltage is higher than the first voltage; and
   pulsing a signal to a gate of a reset transistor in the pixel to connect the row driver to a floating diffusion node in the pixel, thereby turning on a source follower transistor having a gate connected to the floating diffusion node.

10. The method of claim 9, further comprising reading out the pixel through the following steps:
   dropping the signal pulsed to the reset transistor to turn off the reset transistor;
   pulsing a sample-and-hold-reset signal to sample a signal produced from the reset charge value at the floating diffusion node;
   pulsing a signal to a gate of a transfer transistor to transfer charge stored in the photosensor to the floating diffusion node; and
   pulsing a sample-and-hold-signal signal to sample a signal produced from the transferred charge value at the floating diffusion node.

11. The method of claim 10, further comprising deselecting the pixel for readout through the following steps:
   lowering the row driver voltage to the first voltage; and
   pulsing a signal to the gate of the reset transistor to connect the row driver to the floating diffusion node, thereby turning off a source follower transistor having a gate connected to the floating diffusion node.

* * * * *